United States Patent
Kellerman et al.

(10) Patent No.: US 10,415,151 B1
(45) Date of Patent: Sep. 17, 2019

(54) APPARATUS FOR CONTROLLING HEAT FLOW WITHIN A SILICON MELT

(71) Applicant: Varian Semiconductor Equipment Associates, Inc., Gloucester, MA (US)

(72) Inventors: Peter L. Kellerman, Essex, MA (US); Frederick M. Carlson, Potsdam, NY (US); David Morrell, Wakefield, MA (US); Ala Moradian, Beverly, MA (US); Nandish Desai, Waltham, MA (US)

(73) Assignee: VARIAN SEMICONDUCTOR EQUIPMENT ASSOCIATES, INC, Gloucester, MA (US)

( * ) Notice: Subject to any disclaimer, the term of this patent is extended or adjusted under 35 U.S.C. 154(b) by 1112 days.

(21) Appl. No.: 14/227,006

(22) Filed: Mar. 27, 2014

(51) Int. Cl.
*C30B 15/24* (2006.01)
*C30B 15/22* (2006.01)

(52) U.S. Cl.
CPC .............. *C30B 15/24* (2013.01); *C30B 15/22* (2013.01); *Y10T 117/1068* (2015.01)

(58) Field of Classification Search
CPC ......... C30B 15/00; C30B 15/06; C30B 15/10; C30B 15/12; C30B 15/14; C30B 15/20; C30B 15/22; C30B 15/24; C30B 15/34; C30B 28/00; C30B 28/04; C30B 28/10; C30B 29/00; C30B 29/02; C30B 29/06; Y10T 117/00; Y10T 117/10; Y10T 117/1004; Y10T 117/1008; Y10T 117/1024; Y10T 117/1032; Y10T 117/1044; Y10T 117/1048; Y10T 117/1052; Y10T 117/1068

USPC .... 117/11, 13–16, 23, 26–27, 30–31, 73–74, 117/200–202, 206, 208, 209, 211, 213, 117/217, 928, 931–932
See application file for complete search history.

(56) References Cited

U.S. PATENT DOCUMENTS

| 4,264,497 A | 4/1981 | Shudo et al. |
| 4,289,571 A | 9/1981 | Jewett |
| 4,468,281 A | 8/1984 | Bender et al. |
| 4,659,421 A * | 4/1987 | Jewett .................... C30B 15/02 117/21 |

(Continued)

FOREIGN PATENT DOCUMENTS

| AU | 543747 B2 | 5/1985 |
| EP | 1533834 B1 | 11/2013 |

(Continued)

OTHER PUBLICATIONS

International Search Report and Written Opinion dated May 29, 2015, issued in corresponding international patent application No. PCT/US2015/020901.

(Continued)

*Primary Examiner* — Kenneth A Bratland, Jr.

(57) ABSTRACT

An apparatus for controlling heat flow within a melt. The apparatus may include a crucible configured to contain the melt where the melt has an exposed surface. The apparatus may also include a heater disposed below a first side of the crucible and configured to supply heat through the melt to the exposed surface, and a heat diffusion barrier assembly comprising at least one heat diffusion barrier disposed within the crucible and defining an isolation region in the melt and an outer region in the melt.

8 Claims, 8 Drawing Sheets

(56) References Cited

U.S. PATENT DOCUMENTS

| | | | | |
|---|---|---|---|---|
| 5,087,429 | A * | 2/1992 | Kamio | C30B 15/02 |
| | | | | 117/213 |
| 5,871,581 | A * | 2/1999 | Atami | C30B 15/02 |
| | | | | 117/200 |
| 7,855,087 | B2 | 12/2010 | Kellerman et al. | |
| 8,262,797 | B1 | 9/2012 | Bender | |
| 2005/0279275 | A1 * | 12/2005 | Holder | C30B 15/00 |
| | | | | 117/13 |
| 2010/0242836 | A1 * | 9/2010 | Korb | C30B 15/28 |
| | | | | 117/201 |
| 2013/0213296 | A1 | 8/2013 | Kellerman et al. | |
| 2014/0174337 | A1 * | 6/2014 | Swanninathan | C30B 15/12 |
| | | | | 117/14 |

FOREIGN PATENT DOCUMENTS

| | | | |
|---|---|---|---|
| JP | S58-045191 | A | 3/1983 |
| JP | H03-115188 | A | 5/1991 |
| JP | 05319973 | A | 12/1993 |
| WO | 2003/038161 | A1 | 5/2003 |
| WO | 2006028868 | A2 | 3/2006 |
| WO | 2012/151155 | A2 | 11/2012 |
| WO | 2013-007108 | A1 | 1/2013 |

OTHER PUBLICATIONS

B. Kudo, Improvement in the Horizontal Ribbon Growth Technique for Single Crystal Silicon, Journal of Crystal Growth 50, 1980, pp. 247-259, North-Holland Publishing Company, The Netherlands.
Extended European Search Report dated Oct. 6, 2017 for European Patent Application No. 15767728.7.

* cited by examiner

APPARATUS FOR CONTROLLING HEAT FLOW WITHIN A SILICON MELT

STATEMENT AS TO FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

FIELD

The present embodiments relate to growth of crystalline material from a melt and more particularly to forming a single crystalline sheet from a melt.

BACKGROUND

Silicon wafers or sheets may be used in, for example, the integrated circuit or solar cell industry. Demand for solar cells continues to increase as the demand for renewable energy sources increases. One major cost in the solar cell industry is the wafer or sheet used to make solar cells. Reductions in cost to the wafers or sheets may reduce the cost of solar cells and make this renewable energy technology more prevalent. One promising method that has been investigated to lower the cost of materials for solar cells is the horizontal ribbon growth (HRG) technique where crystalline sheets are pulled horizontally along the surface of a melt. In this method, a portion of a melt surface is cooled sufficiently to locally initiate crystallization with the aid of a seed, which may be then drawn along the melt surface to form a crystalline sheet. The local cooling may be accomplished by providing a device that rapidly removes heat above the region of the melt surface where crystallization is initiated. Under proper conditions a stable leading edge of the crystalline sheet may be established in this region.

In order to ensure growth stability, it may be useful to provide sufficient heat flow through the melt directly under the leading edge of the crystalline sheet. It may also be desired to reduce the thickness of the crystalline sheet such as below 200 um, which also requires uniform heat flow under the already-formed portions of the crystalline sheet. However, achieving controlled heat flow within a silicon melt is very challenging for several reasons. Firstly, molten Si has a very high thermal conductivity, so that any heat introduced at the bottom of a crucible that contains the melt spreads out before reaching the melt surface. In addition, the crucible material used to contain silicon melt is fused silica, due to its resistance to reaction with silicon at elevated temperature. However, fused silica is a good thermal insulator such that a large thermal gradient is required to conduct substantial heat to the silicon melt. In turn, this requires that the outer temperature of the fused silica crucible being heated is maintained at a much higher temperature than the melt temperature. However, fused silica softens to an unacceptable degree above 1880 K, which limits the amount of heat flow that can be introduced into the melt. Accordingly present day apparatus may not provide sufficient heat flow to ensure stable growth of a crystalline sheet.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter. In one embodiment, an apparatus for controlling heat flow within a melt is provided. The apparatus may include a crucible configured to contain the melt where the melt has an exposed surface. The apparatus may also include a heater disposed below a first side of the crucible and configured to supply heat through the melt to the exposed surface, and a heat diffusion barrier assembly comprising at least one heat diffusion barrier disposed within the crucible and defining an isolation region in the melt and an outer region in the melt.

In another embodiment, a method to process a melt includes providing the melt in a crucible, the melt having an exposed surface, providing heat through the melt to the exposed surface by heating a first side of the crucible opposite the exposed surface, and providing within the crucible a heat diffusion barrier assembly comprising at least one heat diffusion barrier that defines an isolation region in the melt and an outer region in the melt, wherein a first portion of the heat flows through the isolation region to the exposed surface and has a first heat flow density that is greater than a second heat flow density for a second portion of the heat that flows from the isolation region through the at least one heat diffusion barrier to the outer region.

In a further embodiment, an apparatus for processing a melt may include a heater disposed below a crucible and that contains the melt, where the heater is configured to supply heat through the melt to an exposed surface of the melt. The apparatus may further include a heat diffusion barrier assembly comprising a first heat diffusion barrier and a second heat diffusion barrier that are disposed within the crucible and define an isolation region in the melt and an outer region in the melt, wherein a first portion of the heat that flows through the isolation region to the exposed surface has a first heat flow density that is greater than a second heat flow density for a second portion of the heat that flows from the isolation region through the at least one heat diffusion barrier to the outer region.

DETAILED DESCRIPTION

The present embodiments provide apparatus to control heat flow within a melt such as a silicon melt. Various embodiments advantageously provide uniform heat flow or concentrated heat flow within a melt that facilitates control of horizontal growth of a continuous crystalline sheet of semiconductor material such as silicon. Various embodiments advantageously control heat flow within melts by providing heat diffusion barriers that contain heat flow so as to direct heat flow in the melt, which may overcome the aforementioned problems associated with melt growth.

Various embodiments provide an apparatus for processing a melt that includes a crucible configured to contain the melt, where the melt has an exposed surface. In embodiments for processing silicon melts, the crucible may be composed of fused silica. As with conventional apparatus, a heater may be disposed below a first side of the crucible that is opposite the exposed surface in order to supply heat that moves through the melt to the exposed surface where processing of a crystalline sheet may take place. Unlike conventional apparatus, a heat diffusion barrier assembly is provided that includes at least one heat diffusion barrier disposed within the crucible. The heat diffusion barrier assembly may define an isolation region within the melt as well as an outer region in the melt that lies outside of the isolation region. In this manner, a first portion of heat provided by a heater that flows through the isolation region to the exposed surface may have a first heat flow density that is greater than a second heat flow density for a second portion of the heat that flows from the isolation region through the at least one heat diffusion barrier to the outer region. This feature serves to contain or restrict heat flow so that the heat flow at the surface is tailored in a manner not provided by conventional melt apparatus.

Figure 1A:
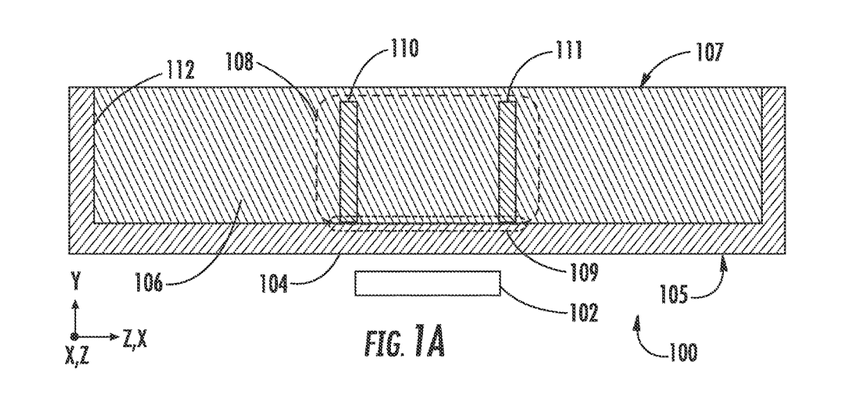
FIG. 1A depicts a cross-sectional view of an apparatus for processing a melt consistent with the present embodiments.

FIG. 1A depicts a cross-sectional view of an apparatus 100 for processing a melt consistent with the present embodiments. The apparatus 100 includes a heater 102 and a crucible 104 that contains a melt 106. In this embodiment and other embodiments, the heater 102 is disposed adjacent or under a first side 105 of the crucible that is opposite an exposed surface 107 of the melt 106. Because the melt 106 is by definition in a liquid state, the first side 105 of the crucible may represent a bottom of the crucible 104, and crucible 104 may further include a sidewall 112. Thus, the sidewall 112 and first side 105 act to contain the melt 106. In operation, the apparatus 100 may be used in conjunction with other components (not shown) to draw a crystalline sheet from the melt 106 as detailed below. In addition to sidewall 112, a heat diffusion barrier assembly 108 is provided within the melt 106, which may be affixed to the crucible 104 in a surface region 109.

In the example of FIG. 1A, the heat diffusion barrier assembly 108 includes a first heat diffusion barrier 110 and second heat diffusion barrier 111, which are disposed opposite one another as shown. In various embodiments, the crucible 104 as well as first heat diffusion barrier 110 and second heat diffusion barrier 111 are composed of fused silica, which is particularly suited for use with a silicon melt. The heat diffusion barrier assembly 108 may be mechanically affixed to the crucible 104 or may be integrally formed as part of the crucible 104. In various embodiments the heat diffusion barrier assembly 108 has low thermal conductivity such that the thermal conductivity is less than 0.1 W/cm-K. This provides a thermal conductivity that is much lower than molten silicon, whose thermal conductivity at 1685 K has been determined to be in the range of 0.6 W/cm-K. For example, thermal conductivity of fused silica in the temperature range of the melting temperature of silicon has been determined to be in the range of 0.05 W/cm-K, which range is more than an order of magnitude lower than thermal conductivity of a silicon melt. This feature of low thermal conductivity is advantageously exploited in the embodiments detailed below to restrict heat flow of heat provided to a melt such as the melt 106. Other suitable examples for use as heat diffusion barriers include a structure that is composed of an inner portion and an outer shell that comes into contact with molten silicon, where the outer shell is composed of fused silica. In this manner, the outer portion presents a material that is non-reactive with molten silicon.

Figure 1B:
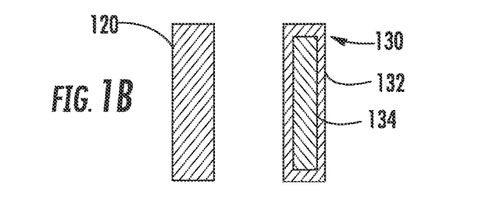
FIG. 1B depicts details of alternative embodiments of heat diffusion barriers.

FIG. 1B depicts details of alternative embodiments of heat diffusion barriers. In one example, a heat diffusion barrier 120 may be a solid structure composed entirely of a single material such as fused silica. In another example, a heat diffusion barrier 130 may have a shell 132 that is composed of a material such as fused silica, which is compatible for use in a silicon melt because of the resistance of fused silica to reaction with silicon. In addition, the heat diffusion barrier 130 may include an inner portion 134 that is constructed to impart a lower overall thermal conductivity to the heat diffusion barrier. This example of heat diffusion barrier 130, the shell 132 if composed of fused silica may completely surround the an inner portion 134, which may have a low thermal conductivity that is even less than that of fused silica, such that the thermal conductivity of the heat diffusion barrier is less than 0.05 W/cm-K. For example, the inner portion 134 may include a gas medium or other medium that has low thermal conductivity. In one example, the inner portion 134 may include a silica areogel or other structure that has a very low thermal conductivity. The overall thermal conductivity of such a heat diffusion barrier 130 may be 0.02 W/cm-K in some instances, or lower. Because the inner portion 134 may be sealed by a fused silica shell, the inner portion 134 may be composed of a low thermal conductivity material that might otherwise react with molten silicon, such as a zirconia fabric. The embodiments are not limited in this context.

Figure 2:
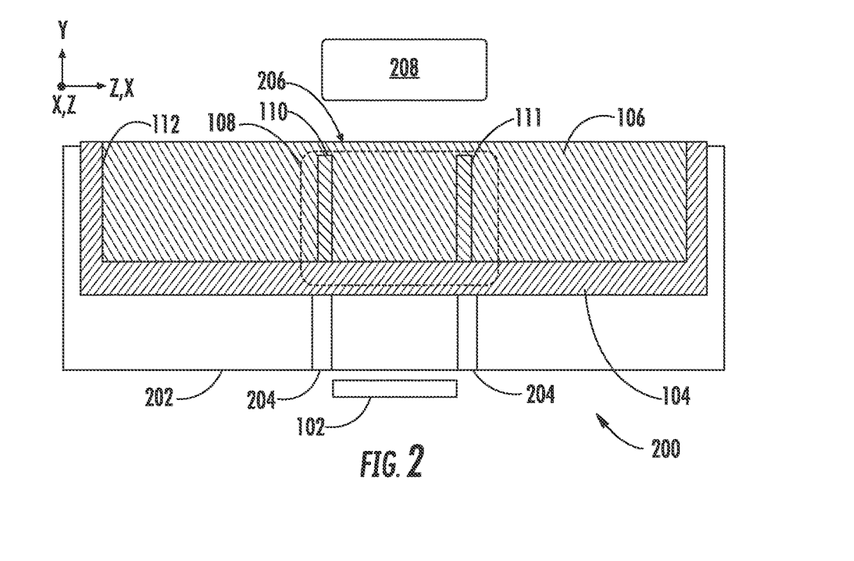
FIG. 2 depicts a cross-sectional view of an apparatus for processing a melt according to further embodiments.

FIG. 2 depicts a cross-sectional view of an apparatus 200 for processing a melt according to further embodiments. This embodiment shares the same components as the apparatus 100, except as noted below. In particular, a crucible holder 202 is provided, which may act also as a heat intensifier. In some embodiments, the crucible holder contains at least one insulator spacer, such as the example of FIG. 2, where the crucible holder 202 is provided with insulator spacers 204 which may be aligned with the first heat diffusion barrier 110 and second heat diffusion barrier 111 in some instances. The crucible holder may be composed of silicon carbide in some embodiments and may confine heat generated by the heater 102 to flow towards the melt 106. For example heat that is generated by the heater 102 may flow upwardly along the direction parallel to the Y-axis of the Cartesian coordinate system shown, and may be confined to a region between the first heat diffusion barrier 110 and second heat diffusion barrier 111. Accordingly a majority of the heat flow generated from the heater 102 may flow outwardly from the exposed surface 206 of melt 106 in a region above the heat diffusion barrier assembly 108. As detailed below, in some embodiments by appropriate design of the heat diffusion barrier assembly 108, the heat flow may be concentrated at the exposed surface 206. For example, a heat flow of 40 W/cm$^2$ may be realized at the exposed surface 206. In other embodiments, the heat flow may be made uniform at the exposed surface 206.

As further shown in FIG. 2 the apparatus 200 includes a crystallizer 208, which may act as a heat sink to aid in the rapid removal of heat that flows from the exposed surface 206. When heat flows to the exposed surface 206, in order to crystallize a sheet, the heat may be removed locally at a rapid rate, such that heat flow from the exposed surface 206 is greater than heat flow to the exposed surface 206. For example the crystallizer 208 may remove heat by providing a cold block to act as a heat sink or may provide a gas to the exposed surface 206 to remove heat. The embodiments are not limited in this context. This rapid removal of heat may result in the formation of a crystallization region in which the material of melt 106 solidifies, allowing a crystalline sheet to be drawn from the melt using a horizontal ribbon growth technique as discussed below. Various embodiments facilitate this process by providing a heat diffusion barrier assembly that concentrates heat flow to the surface 206 sufficiently to stabilize a growing crystalline sheet. In other embodiments, in which heat flow is directed by the heat diffusion barrier assembly 108 to the exposed surface 206 in a uniform manner, this uniform heat flow may be employed to treat an already-formed crystalline sheet, for example.

It is to be noted that in different embodiments a heat diffusion assembly may be provided in different orientations within a crucible. In the convention used herein, the direction of pulling of a crystalline sheet may lie parallel to the Z-axis. As indicated in FIGS. 1A and 2 the view of apparatus 100 or apparatus 200 may be deemed to lie in the Y-Z plane (side view) or alternatively in the X-Z plane (end view), where the Z-axis lies parallel to a pulling direction of a crystalline sheet. Moreover, the orientation of first heat diffusion barrier 110 and second heat diffusion barrier 111 with respect to the Y-axis may vary in different embodiments. In particular, in embodiments suitable for providing uniform heating the first heat diffusion barrier 110 and second heat diffusion barrier 111 may be oriented parallel to the Y-axis and therefore may have walls that are perpendicular to the exposed surface 206, as detailed below with respect to FIGS. 3A-4. In embodiments suitable for providing concentrated heat flow the first heat diffusion barrier 110 and second heat diffusion barrier 111 may, but need not, be oriented at a non-zero angle with respect to the Y-axis as detailed below with respect to FIGS. 5A-8.

Figure 3A:
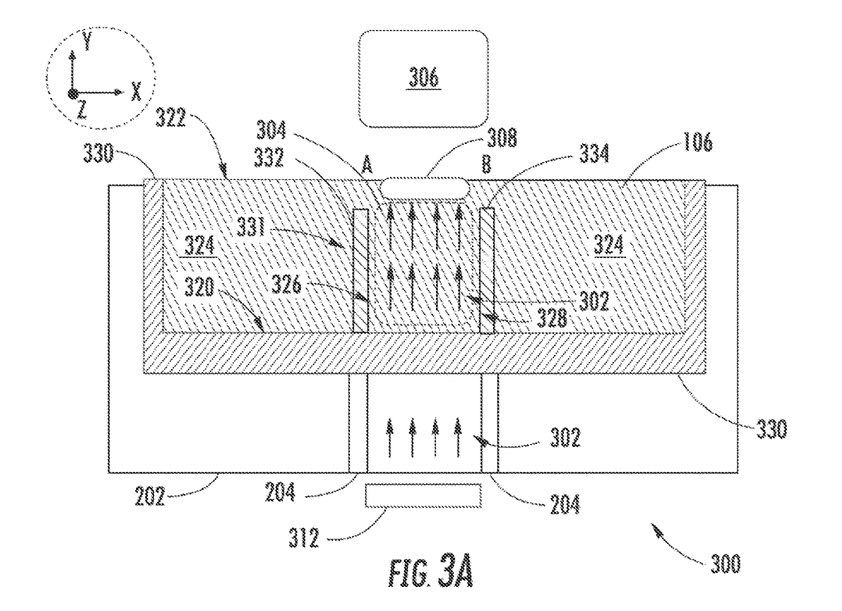
FIG. 3A shows an end cross-sectional view of an apparatus during operation according to further embodiments of the disclosure.
Figure 3B:
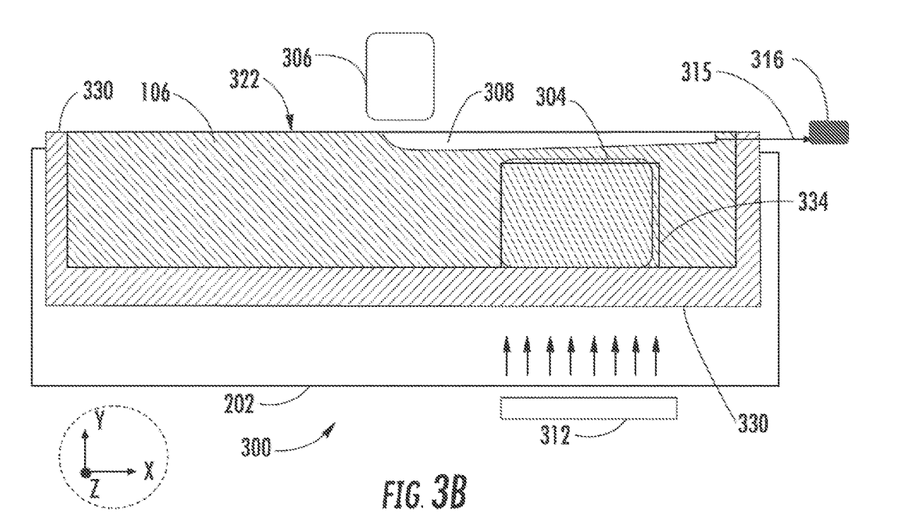
FIG. 3B shows a side cross-sectional view of the apparatus of FIG. 3A.

Turning now to FIG. 3A there is shown an end cross-sectional view of an apparatus 300 during operation according to further embodiments of the disclosure. FIG. 3B shows a side cross-sectional view of the apparatus 300. As illustrated, the apparatus 300 includes a crucible 330 and crucible holder 202 whose operation has been described above. In this embodiment a heat diffusion barrier assembly 331 comprises a first heat diffusion barrier 332 and second heat diffusion barrier 334 that are adjacent the surface 320 of the crucible 330. The first heat diffusion barrier 332 and second heat diffusion barrier 334 may be oriented parallel to the Y-axis and thus perpendicularly to the exposed surface 322 of melt 106. In particular the first heat diffusion barrier 332 may have a first wall 326 and the second heat diffusion barrier 334 may have a second wall 328 that faces the first wall 326, such that the first wall 326 and second wall 328 define sides of the isolation region 304. The first wall 326 may lie parallel to the second wall 328 and may extend perpendicularly to the exposed surface 322.

During operation a heater 312 generates heat flow 302 that proceeds through the crucible holder 202, through crucible 330 and into the melt 106. As noted the melt may be silicon and the first heat diffusion barrier 332 and second heat diffusion barrier 334 may be composed of fused silica, which has a much lower thermal conductivity than silicon at the melt temperature of silicon. Accordingly, the heat flow 302 may be confined within an isolation region 304 defined by the first heat diffusion barrier 332 and second heat diffusion barrier 334. The heat flow density through the isolation region 304, which may be composed of molten silicon, may be more than ten times a heat flow density of heat that flows outwardly from the isolation region 304 into an outer region 324 of the melt 106. The latter heat flow is not indicated in FIG. 3A for clarity. Moreover, by proper arrangement of the heater 312, heat flow density may be uniform across the isolation region 304 so that that heat flow density outwardly from the top of the isolation region 304 may have the same value between points A and B.

As further shown in FIG. 3A, the apparatus 300 includes a crystallizer 306, which may remove heat from the surface 322. The apparatus 300 may also include a crystal puller (not shown). When heat flow is sufficiently rapid from the surface 322 crystallization from the melt 106 may be initiated, a crystal puller 316 may draw a crystalline sheet 308 along the pull direction 315, which is parallel to the Z-axis. As shown in FIG. 3B the first heat diffusion barrier 332 and second heat diffusion barrier 334 are located within the crucible 330 such that the isolation region 304 lies under a portion of the crystalline sheet 308 as it is drawn in the pull direction 315. As the crystalline sheet 308 solidifies and is drawn to the right in FIG. 3B, the crystalline sheet 308 may attain a thickness in the direction parallel to the Y-axis which is greater than desired. In this case, the heater 312 may be employed to generate the heat flow 302 within the isolation region 304 in order to melt back a portion of the crystalline sheet 308 to reduce its thickness. As the crystalline sheet is drawn through the isolation region 304 the heat flow 302 may be sufficient to generate a temperature in the melt 106 adjacent the crystalline sheet 308 that causes melting of the crystalline sheet, for example, along its lower surface. The thickness of the crystalline sheet 308 may then gradually reduce as it is drawn through the isolation region 304, as illustrated. The apparatus 300 provides the advantage that because heat flow is contained within the isolation region 304, a uniform heat flow may be provided to the crystalline sheet 308 so that the thickness of the crystalline sheet is uniformly reduced between points A and B.

It is to be noted that in the embodiments of FIGS. 3A and 3B other heaters may be provided under additional portions of the crucible 330 to provide heat to the melt 106 in at least two heating zones to maintain a desired melt temperature in other portions of the melt 106 outside of the isolation region 304. However, because the first heat diffusion barrier 332 and second heat diffusion barrier 334 restrict heat flow within the isolation region 304, the direction of heat flow can be channeled perpendicularly to the exposed surface 322 and heat flow density can be maintained at a uniform value across the isolation region 304, which heat flow density may be different than that in outer region 324.

Figure 3C:
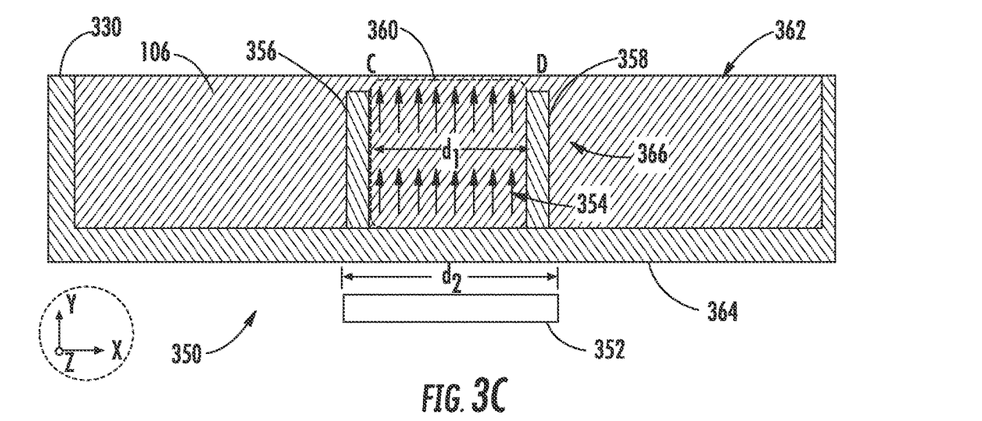
FIG. 3C depicts an apparatus arranged according to additional embodiments of the disclosure.

In order to tailor heat flow within an isolation region, the geometry of a heater and heat diffusion barrier assembly may be adjusted. FIG. 3C depicts an apparatus 350 arranged according to additional embodiments of the disclosure. For simplicity the apparatus 350 is depicted without a crucible holder but may include a crucible holder in various embodiments. As illustrated, the apparatus 350 contains a crucible 364 and a heat diffusion barrier assembly 366 including a first heat diffusion barrier 356 and second heat diffusion barrier 358, which may extend parallel to the Y-axis as described above with respect to the embodiments of FIGS. 3A, 3B. A heater 352 is provided that acts as a uniform heat source across a heater width $d_2$ as indicated. The heater 352 may generate heat flow 354 that proceeds towards the surface 362 of melt 106 through an isolation region 360 defined by the first heat diffusion barrier 332 and second heat diffusion barrier 334. In order to increase uniformity of the heat flow 354 within the isolation region 360 and increase the uniformity of heat flow between points C and D at the exposed surface 362, an isolation region width $d_1$ may be adjusted relative to the heater width $d_2$. In some instances the heater width $d_2$ may be greater than isolation region width $d_1$.

Figure 4:
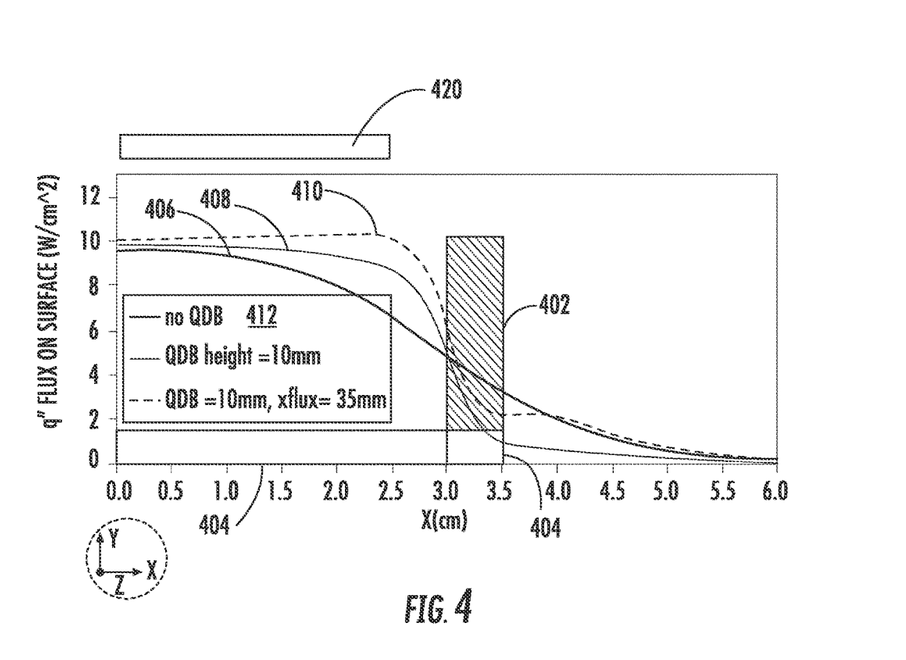
FIG. 4 presents a composite drawing that includes simulation of heat flow at an exposed surface of a melt under three different geometries.

FIG. 4 presents a composite drawing that includes simulation of heat flow at an exposed surface of a 13 mm deep melt under three different geometries. The results are based upon computational fluid dynamics calculations as applied to a silicon melt in which a uniform heat source 404 is provided along a lower edge of the melt. A heat diffusion barrier 402 made of fused silica having a width of 5 mm (along the X-axis) and a height (along the Y-axis) of 10 mm is placed adjacent an isolation region having a full width of 60 mm and therefore a half-width of 30 mm, as shown in FIG. 4. The heat flow density (q″) for all geometries at the bottom of a melt (along the Y-axis) is 10 W/cm.$^2$ The curve 406 represents the heat flow density profile for one half of a symmetrical profile when no heat diffusion barrier is present in the melt, expressed as a function of position along a melt surface parallel to the X-axis. As illustrated, the heat flow density at the melt surface in the center region (X=0) is very close to the initial heat flow at the bottom of the melt of 10 W/cm.$^2$ The heat flow density gradually decreases in a direction proceeding toward the edge of the uniform heat source, such that heat flow density is less than 7 W/cm$^2$ at X=30 mm, which still lies directly above the uniform heat source 404. The curve 408 represents the heat flow density profile when a heat diffusion barrier 402 is present and when the uniform heat source 404 extends just to the edge of an isolation region 412 at X=30 mm. As illustrated, the heat flow density is more uniform and maintains a value between 9-10 W/cm$^2$ until 25 mm. The curve 410 represents the heat flow density profile when a heat diffusion barrier 402 is present and when the uniform heat source extends to a position beyond the edge of an isolation region 412 to X=35 mm. As illustrated, the heat flow density is still more uniform and maintains a value close to 10 W/cm$^2$ until 25 mm. It can be seen from the results of FIG. 4 that uniform heat flow at a melt surface can be tuned to a desired width by appropriate placement of heat diffusion barriers in combination with a heat source. This can be exploited in an apparatus for growth of a crystalline sheet by arranging the width of a region of uniform heat flow to cover the width of the crystalline sheet to be processed along a transverse direction that is perpendicular to a pull direction of the crystalline sheet. This is illustrated in FIG. 4 by the crystalline sheet 420 whose half-width is 25 mm so that the entire width (other half that is not shown is to the left of the position X=0) can be subject to the same heat flow when the crystalline sheet 420 is positioned as shown.

Figure 5A:
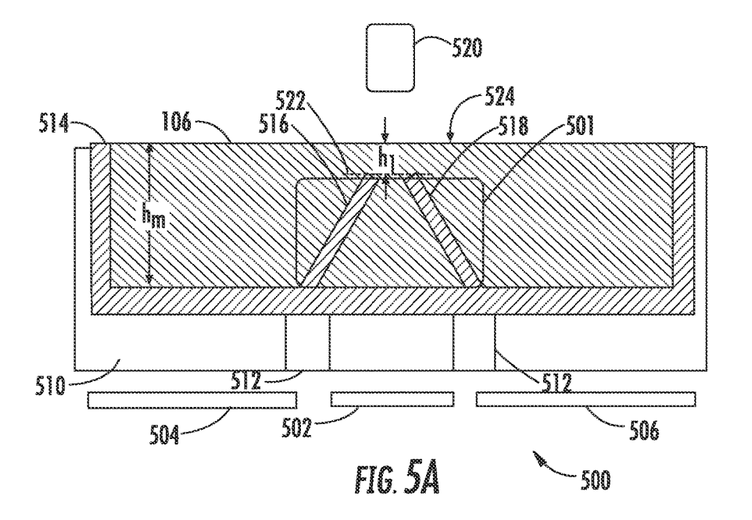
FIG. 5A depicts one embodiment of an apparatus in which a heat flow barrier assembly is arranged to increase heat flow density as heat travels through a melt.

In further embodiments, the properties of a heat diffusion barrier can be exploited to concentrate heat flow provided to a surface of a melt. FIG. 5A depicts one embodiment of an apparatus 500 in which the heat diffusion barrier assembly 501 is arranged to increase heat flow density as heat travels through a melt 106. The apparatus includes a heater 502, heater 504, and heater 506, which are disposed under separate portions of a crucible 514. A crucible holder 510 is disposed between the crucible 514 and heaters. The crucible holder 510 includes insulating spacers 512 that define separate regions along the bottom of the crucible 514, which can be heated separately by heater 502, heater 504, or heater 506. The heater 502 is disposed under the heat diffusion barrier assembly 501, which is composed of a first heat diffusion barrier 516 and second heat diffusion barrier 518. Each of the first heat diffusion barrier 516 and second heat diffusion barrier 518 are angled with respect to the exposed surface 524 of melt 106, such that the separation between them is greater at portions of the heat diffusion barrier assembly 501 further from the exposed surface 524 compared with those portions closer to the exposed surface 524. As further shown in FIG. 5A, the first heat diffusion barrier 516 and second heat diffusion barrier 518 are disposed below the exposed surface 524, where a top portion of the heat diffusion barrier assembly defines a plane 522 that lies within the melt 106. In some examples, the depth $h_m$ of the melt 106 along a direction parallel to the Y-axis may be 10 mm to 20 mm and the distance $h_1$ between plane 522 and exposed surface 524 may be 1 mm to 5 mm. The apparatus 500 may further include a crystallizer 520 that is disposed above the heat diffusion barrier assembly 501. It is to be noted that is some embodiments, the first heat diffusion barrier 516 and second heat diffusion barrier 518 may form the same angle with respect to the exposed surface 524, in other embodiments, the first heat diffusion barrier 516 may form a first angle with respect to the exposed surface 525 that is different from a second angle formed by second heat diffusion barrier 518 with respect to the exposed surface 524. Such an asymmetric orientation of the first heat diffusion barrier 516 and second heat diffusion barrier 518 may be useful if an asymmetric flux distribution of heat is to be generated.

In operation the apparatus 500 may heat the melt 106 using any combination of heater 502, heater 504, and heater 506. When heater 502 is active heat flow delivered to the melt 106 may be concentrated at the exposed surface 524. The concentrated heat flow may be used to stabilize growth of a crystalline sheet that is produced on or near the exposed surface 524. In order for crystallization to take place, heat may be removed at a more rapid rate than the concentrated heat flow provided to the exposed surface 524.

Figure 5B:
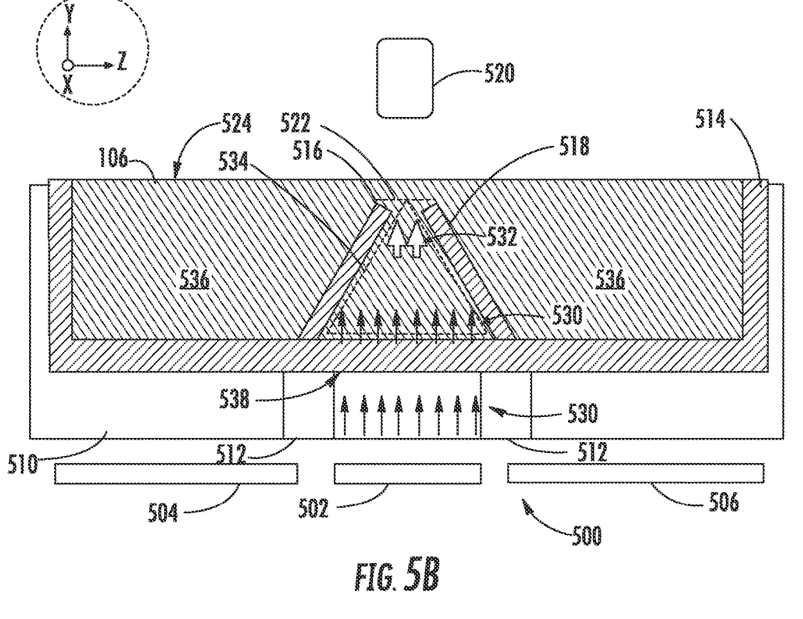
FIG. 5B depicts one instance of operation of the apparatus of FIG. 5A.

FIG. 5B depicts one example of operation of the apparatus 500. In this example, heater 502 is active and supplies heat to the melt 106. Heater 504 and heater 506 may also be active but are not considered herein for simplicity. It may be assumed in one example that the melt 106 is silicon and that the temperature of the exposed surface 524 is 1685 K, which is the melting temperature of silicon. As illustrated, heat flow 530 moves upwardly through the crucible holder 510 and into the isolation region 534 defined by the heat diffusion barrier assembly 501 (see FIG. 5A). The heat diffusion barrier assembly 501 presents a barrier to heat flow outwardly into outer region 536. Accordingly, concentrated heat flow 532 is generated at the upper portion of the heat diffusion barrier assembly 501.

As noted previously a suitable material for crucible 514 is fused silica due to its resistance to reaction with a silicon melt and the fact that it does not introduce contaminant metallic species into a silicon melt. However, as detailed below, the softening point and thermal impedance of a fused silica crucible limits the allowable heat flow through the bottom of the crucible 514. This limit is due in part to the fact that fused silica has a low thermal conductivity and therefore generates a large temperature drop from outside of a crucible to inside. Given a thermal conductivity of fused silica (~0.05 W/cm-K at 1700 K) a 4 mm thick crucible generates a temperature drop of 160 K when 20 W/cm$^2$ is applied, requiring a temperature of at least 1845 K outside the crucible to maintain a silicon melt at 1685 K melting temperature at the bottom of the melt. However, given that the melt has a finite depth such as 12 mm, a further drop in temperature occurs between the bottom and top of the melt, which may be in the range 30-40 K for heat flow of 15 W/cm$^2$-20 W/cm$^2$ so that the melt temperature at the bottom of the melt is often at least 1715 K-1725 K to generate a surface melt temperature of 1685 K.

The above considerations therefore set a minimum temperature in the range of 1885 K to maintain the melt surface at 1685 K melting temperature of silicon when a heat flow density of 20 W/cm$^2$ provided to a silica crucible in conventional apparatus. However, the limit of heat flow density of 20 W/cm$^2$ for conventional apparatus may be insufficient to stabilize a growing sheet of crystalline silicon. The heat diffusion barrier assembly 501 addresses this problem by concentrating heat flow towards the exposed surface 524. In one particular example it may be assumed that the heat flow 530 is 15 W/cm$^2$ as conducted through the bottom of crucible 514 and into a bottom portion of the isolation region 534 where the area of the isolation region 534 is $A_1$. For the purposes of illustration, the heat diffusion barrier assembly 501 may be angled such that the area of the isolation region at the plane 522 is $A_1/3$, which intensifies the heat flow so heat flow 532 has a value of ~45 W/cm$^2$. Given the conductivity of Si (0.6 W/cm-K), a temperature gradient varies from ~3 K/mm at the bottom of the melt 506 to ~7 K/mm at the plane 522, averaging ~5 K/mm. Accordingly, a net temperature difference from bottom of the crucible 514 to the top of the heat diffusion barrier assembly 501 is 50 K, assuming a height of 10 mm for the heat diffusion barrier assembly 501. In an example in which the plane 522 lies 3 mm below the exposed surface 524, the temperature of the melt 106 at plane 522 is equal to 3 mm×7 K/mm, or 21 K, higher than that of the exposed surface 524, making the temperature at the bottom of the crucible 71 K higher than that of the exposed surface 524. Accordingly, the temperature at the bottom of the melt 106 may be maintained at 1685 K+71 K or 1756 K.

Given a thermal conductivity of fused silica (~0.05 W/cm-K at 1700 K), the heat flow through the crucible 514 for 15 W/cm$^2$ heat flow density supplied from heater 502 develops a temperature gradient of ~30 K/mm. For a reasonable thickness of the crucible 514 of 4 mm this leads to a temperature on the bottom surface 538 of crucible 514 of 30 K/mm×4 mm, or 120 K, higher than the temperature at the bottom of the melt 106, or 1756 K+120 K=1876 K. This temperature is below the temperature range at which severe softening of the crucible 514 may occur.

Accordingly, since merely 15 W/cm$^2$ heat flow density is generated through the bottom of the crucible 514, the apparatus 500 may deliver a heat flow of ~45 W/cm$^2$ to the plane 522 without compromising crucible integrity, which may not be possible using conventional apparatus. It may be noted that, for a given heat flow into the bottom of a crucible, the use of an angled heat diffusion barrier assembly may create a higher thermal gradient on average than in conventional apparatus that do not employ heat diffusion barriers. For example, a conventional apparatus that supplies 15 W/cm$^2$ would generate a thermal gradient of ~3 K/mm throughout the melt, while in the above embodiment the average thermal gradient was 5 K/mm. However, in order to generate 45 W/cm$^2$ at the melt surface a conventional apparatus would need to generate 45 W/cm$^2$ at the bottom of the melt, which would lead to a temperature gradient of 90 K/mm or a temperature drop across a 4 mm thick crucible of 360 K. In addition, heat flow density of 45 W cm$^2$ would produce a thermal gradient in excess of 7 K/mm in the silicon melt, leading to a temperature drop of 70 K through a 10 mm deep melt. Accordingly, a temperature on the outside of the crucible would need to be at least 1685 K+70 K+360 K, or 2115 K in order to generate a temperature of 1685 K at the melt surface. However, the integrity of a fused silica crucible would not be maintained at 2115 K due to severe softening or flow at such a high temperature.

Figure 5C:
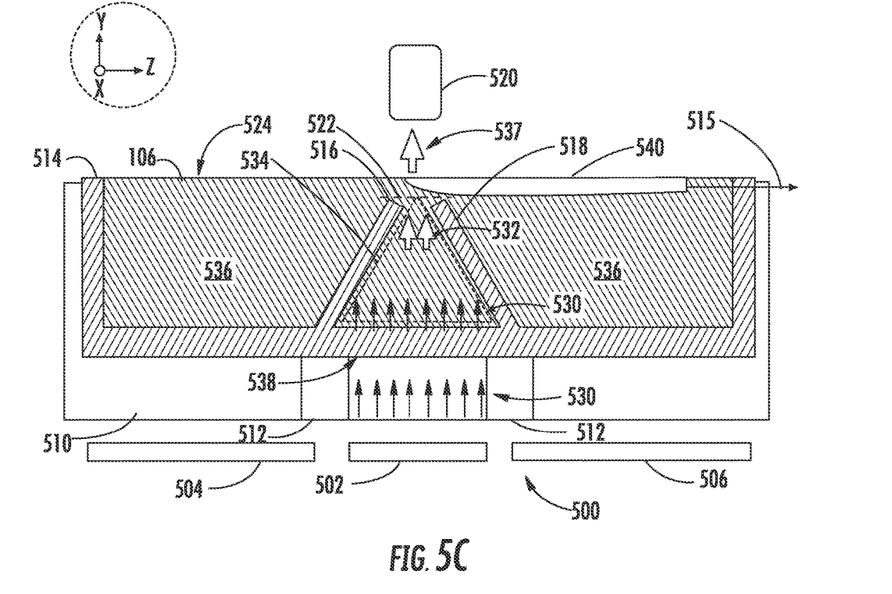
FIG. 5C depicts a further instance of operation of the apparatus of FIG. 5A.

FIG. 5C depicts a further instance of operation of the apparatus 500 in which the crystallizer 520 removes heat from the exposed surface 524, shown as the heat flow 537. The heat flow 537 may exceed that of the heat flow 532, such that crystallization takes place at the exposed surface 524 above the heat diffusion barrier assembly 501. A crystal puller (not shown) may draw a crystalline sheet 540 by moving along the pull direction 515 as shown. An advantage provided by the apparatus 500 for forming crystalline sheets is that the apparatus 500 is capable of generating high heat flow density at a surface of a melt in excess of 20 W/cm$^2$, such as from 30 W/cm$^2$ to 50 W/cm$^2$ which levels are not accomplished by conventional apparatus. The present inventors have recognized that such high levels of heat flow density may be useful to stabilize growth of crystalline sheets in horizontal growth apparatus such as those disclosed herein.

Figure 6:
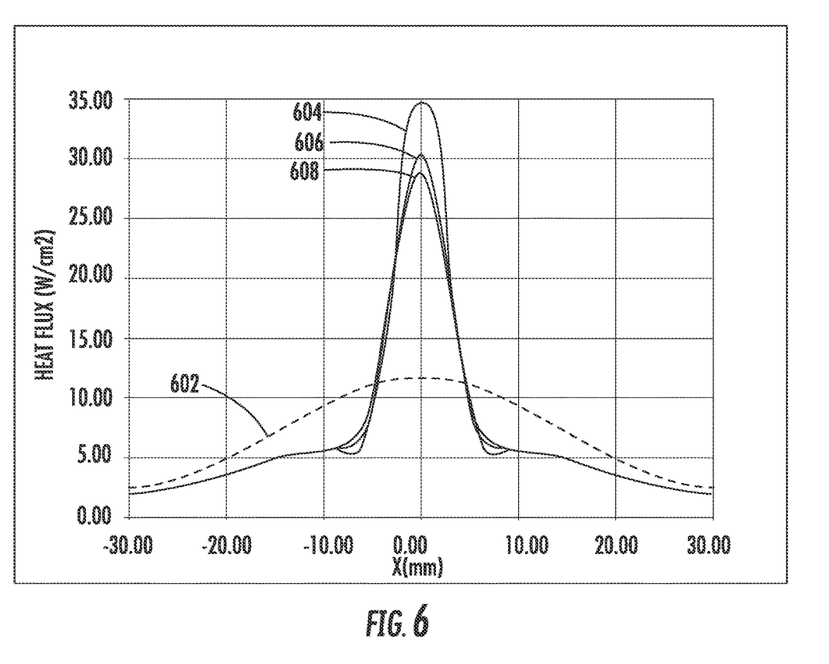
FIG. 6 depicts exemplary heat flow density curves for various scenarios.

It is noted that in order accommodate formation of a sheet of crystalline material along a melt surface the top of a heat diffusion barrier assembly 501 may be located below the surface of a melt. However, high heat flow density may still be delivered to the surface of the melt even when the heat diffusion barrier assembly does not extend to the surface. FIG. 6 depicts exemplary heat flow density curves for various scenarios. The results are based upon computational fluid dynamics calculations as applied to a silicon melt in which a heat flow of 15 W/cm$^2$ is provided at the bottom of a melt whose depth is 13 mm. The top of a heat diffusion barrier assembly may be assumed to be 3 mm below a surface of the melt. The curve 602 illustrates the case in which no heat diffusion barrier assembly is present. In this case a broad peak in heat flow density occurs with a peak value of less than 12 W/cm$^2$. Curve 604 illustrates the case in which an angled heat diffusion barrier assembly is present and heat flow density is computed at the top of the heat diffusion barrier assembly. In this case, a narrow peak having a full width at half maximum (FWHM) in the range of 5 mm to 6 mm is observed having a peak value of 35 W/cm$^2$ illustrating the heat flow density enhancement afforded by using the heat diffusion barrier assembly. Curve 606 illustrates the case in which an angled heat diffusion barrier assembly is present and heat flow density is computed 1 mm below the surface of the melt. In this case, a narrow peak is observed having a peak value of 30 W/cm$^2$ illustrating the heat flow density enhancement still persists. Curve 608 illustrates the case in which an angled heat diffusion barrier assembly is present and heat flow density is computed at the surface of the melt. In this case, a narrow peak is observed having a peak value of 28.5 W/cm$^2$ illustrating that the majority of the heat flow density enhancement produced by the angled heat diffusion barrier assembly still persists.

Figure 7:
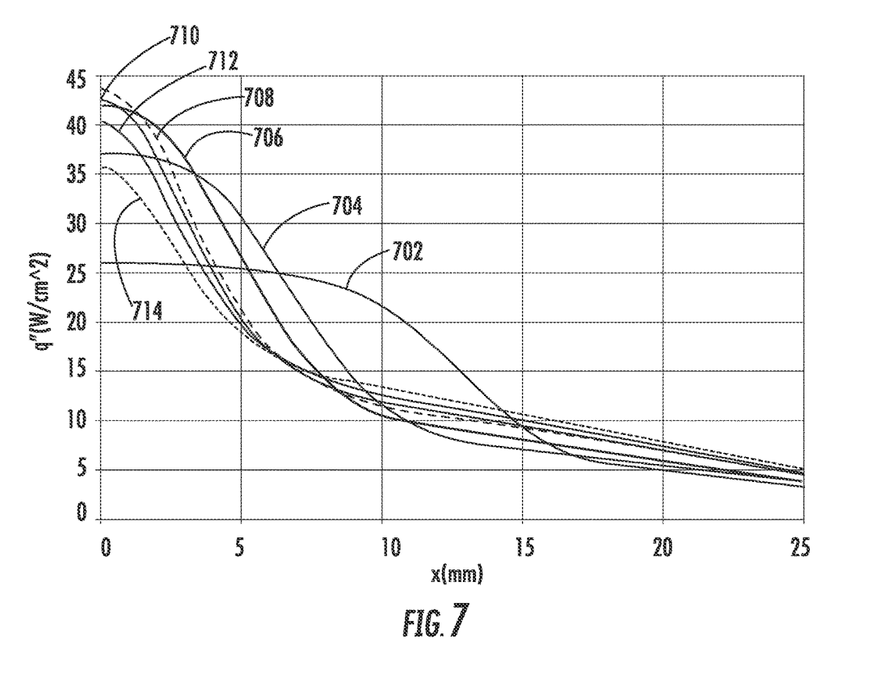
FIG. 7 depicts exemplary heat flow density curves for various additional scenarios.

It is to be noted that the exact amount of enhancement of heat flow density at a melt surface may be tailored by adjusting the angle of heat diffusion barriers as well as their distance from a melt surface. FIG. 7 depicts exemplary heat flow density curves for various different scenarios, in which the gap or separation of heat diffusion barriers at the top of a heat diffusion barrier assembly is varied. In FIG. 7, all the heat flow density curves reflect calculations based upon a heat diffusion barrier assembly having a separation of 25 mm at the bottom adjacent a crucible bottom. By adjusting the angle of the diffusion barrier walls the gap at the top of the diffusion barrier assembly is adjusted. Curve 702 illustrates the case in which the gap at the top of the heat diffusion barrier assembly is 25 mm, such that the isolation region has a constant width. In this instance a wide peak having a maximum value of 26.3 W/cm$^2$ is generated. Curve 704 illustrates the case in which the gap at the top of the heat diffusion barrier assembly is 12 mm. In this instance a narrower peak having a maximum value of 37.4 W/cm$^2$ is generated. Curve 706 illustrates the case in which the gap at the top of the heat diffusion barrier assembly is 8 mm. In this instance a still narrower peak having a maximum value of 42.4 W/cm$^2$ is generated. Curve 708 illustrates the case in which the gap at the top of the heat diffusion barrier assembly is 4 mm. In this instance a yet narrower peak having a maximum value of 44.1 W/cm$^2$ is generated. Curve 710 illustrates the case in which the gap at the top of the heat diffusion barrier assembly is 3 mm. In this instance a yet narrower peak having a maximum value of 42.9 W/cm$^2$ is generated. Curve 712 illustrates the case in which the gap at the top of the heat diffusion barrier assembly is 2 mm. In this instance a yet narrower peak having a maximum value of 40.6 W/cm$^2$ is generated. Curve 714 illustrates the case in which the gap at the top of the heat diffusion barrier assembly is 1 mm. In this instance a still narrower peak having a maximum value of 35 W/cm$^2$ is generated. The decrease in maximum heat flux values for gap dimension less than 4 mm may be attributed to increased thermal impedance caused by the reduced gap through which heat may be conducted within the high-thermal conductivity molten silicon.

From the above results it can be observed that angling a heat diffusion barrier assembly to decrease the gap at the top of the heat diffusion barrier assembly from 25 mm to 4 mm has the effect of increasing a peak value of heat flux density. It can further be observed that the maximum peak value occurs when the gap is 4 mm and decreases at smaller gaps. Accordingly, these results demonstrate that the heat flow density can be tuned by adjusting the relative size of the gap at the top and bottom of a heat diffusion barrier assembly. It is also to be noted from the above results that the width of the peak of heat flux density such as FWHM may be adjusted to maintain a narrow peak that delivers heat in a narrow zone, which may be suitable for stabilizing the leading edge of a silicon sheet.

Figure 8:
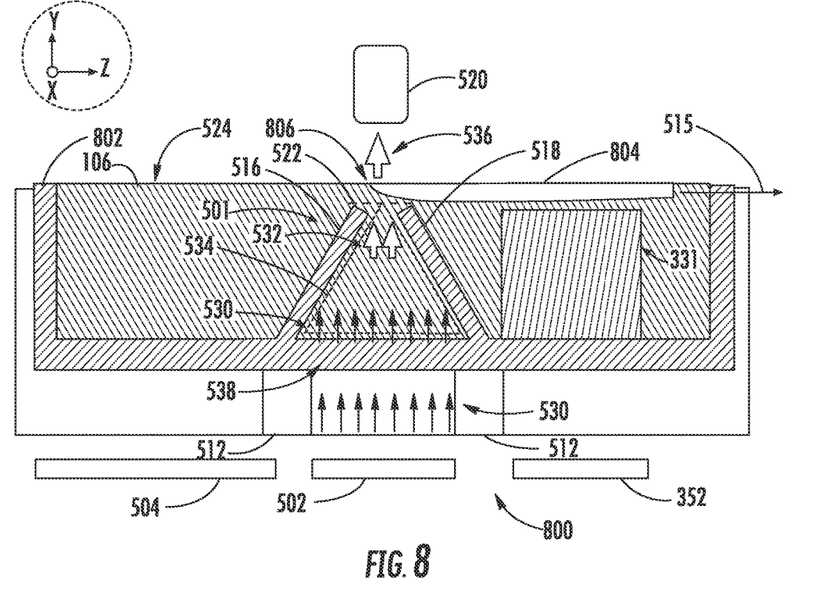
FIG. 8 depicts one example of operation of an according to further embodiments.

In other embodiments, an apparatus for processing a melt may include multiple heat diffusion barrier assemblies. In particular embodiments, an apparatus may include a first heat diffusion barrier assembly to generate concentrated heat flow at a melt surface and a second heat diffusion barrier to generate a uniform heat flow in a target region of the melt. FIG. 8 depicts one example of operation of an apparatus 800 that includes heat diffusion barrier assembly components of the apparatus 500 and the apparatus 300 as described herein above. In particular, heat diffusion barrier assembly 501 is operative to generate the concentrated heat flow 532 as described hereinabove. This heat flow may exceed, for example, 30 W/cm,$^2$ and may be employed to stabilize growth of a leading edge 806 of the crystalline sheet 804. This may occur when heat flow 537 is removed by the crystallizer 520 from the exposed surface 524 and crystallization takes place. The apparatus 800 also includes a heater 352 and heat diffusion barrier assembly 366 whose operation has been described hereinabove with respect to FIG. 3C. In particular, the heat diffusion barrier assembly 366 and heater 352 may provide heat flow towards the crystalline sheet 804 along the Y-axis that is uniform in heat flow density across the width of the crystalline sheet 804 parallel to the X-axis, as generally shown in FIG. 3C and FIG. 4. Accordingly, the heat diffusion barrier assembly 366 may melt back a portion of the crystalline sheet 804 in a uniform manner across its width as suggested in FIG. 8. Thus, the apparatus 800 provides both improved heat flow to stabilize a leading edge of a crystalline sheet as well as uniform heat flow to uniformly process the crystalline sheet, such as to provide uniform melt back across the width of the crystalline sheet.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for controlling heat flow within a melt, comprising:
    a crucible configured to contain the melt, the melt having an exposed surface;
    a heater disposed below a first side of the crucible and configured to supply heat through the melt to the exposed surface;
    a heat diffusion barrier assembly comprising at least one heat diffusion barrier disposed within the crucible and defining an isolation region in the melt and an outer region in the melt, wherein the heat diffusion barrier assembly is disposed below the exposed surface, and wherein the heater is disposed to generate in the isolation region a first heat flow density at the exposed surface, and is arranged to generate in the outer region a second heat flow density at the exposed surface, less than the first heat flow density, wherein the heat diffusion barrier assembly comprises a first heat diffusion barrier and second heat diffusion barrier that are angled, wherein the isolation region is wider toward a bottom of the crucible, wherein top portions of the first and second heat diffusion barriers are free and unattached to other structures such that the melt is disposed between the first heat diffusion barrier and the second heat diffusion barrier at a top portion of the diffusion barrier assembly; and a crystal puller, disposed above the melt and movable along a direction parallel to the exposed surface.

2. The apparatus of claim 1, wherein the at least one heat diffusion barrier is composed of fused silica.

3. The apparatus of claim 1, wherein the melt is composed of silicon, and wherein a first portion of the heat that flows through the isolation region to the exposed surface has a first heat flow density that is greater than a second heat flow density for a second portion of the heat that flows from the isolation region through the at least one heat diffusion barrier to the outer region.

4. The apparatus of claim 1, further comprising a crucible holder disposed between the heater and crucible and having at least one insulator spacer arranged to generate at least two heating zones that provide heat to the melt.

5. The apparatus of claim 4, wherein the crucible holder is a heat intensifier.

6. The apparatus of claim 1,
wherein the heater is configured to generate heat flow into the isolation region across a heater width greater than the isolation region width,
wherein the heat flow at the surface region is uniform across the isolation region between the first heat diffusion barrier and second heat diffusion barrier.

7. An apparatus for processing a melt, comprising:
a heater disposed below a crucible that contains the melt, the heater being configured to supply heat through the melt to an exposed surface of the melt;
a heat diffusion barrier assembly comprising a first heat diffusion barrier and a second heat diffusion barrier that are disposed within the crucible and define an isolation region in the melt and an outer region in the melt, wherein the heat diffusion barrier assembly is disposed below the exposed surface, wherein the first heat diffusion barrier and second heat diffusion barrier are angled, wherein the isolation region is wider-toward a bottom of the crucible, wherein top portions of the first and second heat diffusion barriers are free and unattached to other structures such that the melt is disposed between the first heat diffusion barrier and the second heat diffusion barrier at a top portion of the diffusion barrier assembly, and wherein the heater is disposed to generate in the isolation region a first heat flow density at the exposed surface, and is arranged to generate in the outer region a second heat flow density at the exposed surface, less than the first heat flow density,
wherein the first heat flow density is greater than a third heat flow density that flows from the isolation region through the at least one heat diffusion barrier to the outer region; and
a crystal puller, disposed above the melt and movable along a direction parallel to the exposed surface.

8. The apparatus of claim 7, wherein the crucible and heat diffusion barrier assembly are composed of fused silica.

* * * * *